United States Patent
Xu et al.

(10) Patent No.: US 12,249,490 B2
(45) Date of Patent: Mar. 11, 2025

(54) SINGLE CRYSTAL METAL OXIDE PLASMA CHAMBER COMPONENT

(71) Applicant: LAM RESEARCH CORPORATION, Fremont, CA (US)

(72) Inventors: Lin Xu, Fremont, CA (US); Douglas Detert, Fremont, CA (US); John Daugherty, Fremont, CA (US); Pankaj Hazarika, Fremont, CA (US); Satish Srinivasan, Fremont, CA (US); Nash W. Anderson, Fremont, CA (US); John Michael Kerns, Fremont, CA (US); Robin Koshy, Fremont, CA (US); David Joseph Wetzel, Fremont, CA (US); Lei Liu, Fremont, CA (US); Eric A. Pape, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 17/770,147

(22) PCT Filed: Oct. 21, 2020

(86) PCT No.: PCT/US2020/056707
§ 371 (c)(1),
(2) Date: Apr. 19, 2022

(87) PCT Pub. No.: WO2021/091695
PCT Pub. Date: May 14, 2021

(65) Prior Publication Data
US 2022/0392753 A1 Dec. 8, 2022

Related U.S. Application Data

(60) Provisional application No. 62/939,422, filed on Nov. 22, 2019, provisional application No. 62/930,872, filed on Nov. 5, 2019.

(51) Int. Cl.
*H01J 37/32* (2006.01)

(52) U.S. Cl.
CPC .... *H01J 37/32467* (2013.01); *H01J 37/3244* (2013.01)

(58) Field of Classification Search
CPC ............. H01J 37/32467; H01J 37/3244; H01J 37/32449; C23C 16/45561
(Continued)

(56) References Cited

U.S. PATENT DOCUMENTS 6,412,438 B2 * 7/2002 Kamarehi ......... H01J 37/32357
                                                 156/345.35
9,051,647 B2    6/2015 Cooperberg et al.
(Continued)

FOREIGN PATENT DOCUMENTS

CN    101414537    4/2009
CN    113165139    7/2021
(Continued)

OTHER PUBLICATIONS

Machine Translation of WO/2020-110964-A1.*
(Continued)

*Primary Examiner* — Rudy Zervigon
(74) *Attorney, Agent, or Firm* — Beyer Law Group LLP

(57) ABSTRACT

A component of a plasma processing chamber having at least one plasma facing surface of the component comprises single crystal metal oxide material. The component can be machined from a single crystal metal oxide ingot. Suitable single crystal metal oxides include spinel, yttrium oxide, and yttrium aluminum garnet (YAG). A single crystal metal oxide can be machined to form a gas injector of a plasma processing chamber.

11 Claims, 6 Drawing Sheets

(58) Field of Classification Search
USPC .................. 118/715; 156/345.33, 345.34
See application file for complete search history.

(56) References Cited

U.S. PATENT DOCUMENTS

| | | | |
|---|---|---|---|
| 9,633,822 B2 | 4/2017 | Tanaka | |
| 9,790,596 B1 | 10/2017 | Kajiwara | |
| 10,403,475 B2 | 9/2019 | Cooperberg et al. | |
| 2003/0070620 A1* | 4/2003 | Cooperberg | H01J 37/3244 118/723 AN |
| 2006/0137613 A1* | 6/2006 | Kasai | H01J 37/32192 118/723 ME |
| 2009/0221149 A1* | 9/2009 | Hammond, IV | H01J 37/32449 156/345.33 |
| 2014/0283995 A1 | 9/2014 | Tanaka | |
| 2016/0086779 A1* | 3/2016 | Hamaya | H01L 29/4933 438/682 |
| 2019/0276366 A1 | 9/2019 | Sun et al. | |
| 2022/0020563 A1* | 1/2022 | Noguchi | B05B 1/005 |

FOREIGN PATENT DOCUMENTS

| | | |
|---|---|---|
| JP | H9-293774 | 11/1997 |
| JP | 2002-057388 | 2/2002 |
| JP | 2004-244312 | 9/2004 |
| JP | 2011-029645 | 2/2011 |
| JP | 2012-054266 | 3/2012 |
| JP | 2015-224159 | 12/2015 |
| JP | 2020-165771 * | 3/2019 |
| JP | 2021-054664 | 4/2021 |
| KR | 10-2007-0079835 | 8/2007 |
| TW | 201629266 | 8/2016 |
| WO | 02-067312 | 8/2002 |
| WO | 2004/073363 | 8/2004 |
| WO | 2012-165334 | 12/2012 |
| WO | 2013/065666 | 10/2013 |
| WO | WO-2020-110964 A1 * | 4/2020 |

OTHER PUBLICATIONS

International Search Report from International Application No. PCT/US2020/056707 dated Feb. 19, 2021.
Written Opinion from International Application No. PCT/US2020/056707 dated Feb. 19, 2021.
Japanese Notice of Reasons for Refusal from Japanese Application No. 2022-525164 dated Jun. 18, 2024 with machine translation.
Taiwanese First Office Action from Taiwanese Application No. 109138537 dated Apr. 30, 2024 with machine translation.
Chinese Office Action from Chinese Application No. 202080076017.9 dated Nov. 1, 2024 with Machine Translation.
Taiwanese Office Action from Taiwanese Application No. 109138537 dated Nov. 13, 2024 with Machine Translation.

* cited by examiner

SINGLE CRYSTAL METAL OXIDE PLASMA CHAMBER COMPONENT

REFERENCE TO RELATED APPLICATIONS

This application claims the benefit of U.S. Provisional Patent Application No. 62/930,872, filed on Nov. 5, 2019, and U.S. Provisional Patent Application No. 62/939,422, filed on Nov. 22, 2019. The foregoing applications are hereby incorporated by reference herein for all purposes.

BACKGROUND

The disclosure relates to plasma processing chambers for plasma processing of a semiconductor wafer. More specifically, the disclosure relates to a single crystal metal oxide component in semiconductor processing chambers.

Plasma processing is used in forming semiconductor devices. During the plasma processing, components of the plasma processing chamber may be eroded by the plasma. Parts of the plasma processing chamber that are eroded by plasma is a source of contaminants. It is therefore desirable to form plasma processing chamber components of materials that are resistant to such plasma erosion.

SUMMARY

According to an embodiment, a method is provided for forming a component of a plasma processing chamber. At least one single crystal metal oxide ingot is provided. The at least one single crystal metal oxide ingot is machined to form the component; A surface treatment is performed on the component after machining.

According to another embodiment, a component of a plasma processing chamber is provided. At least one plasma facing surface of the component comprises single crystal metal oxide material.

According to yet another embodiment, a gas injector of a plasma processing chamber is provided. The gas injector includes a body and at least one plasma facing surface comprising a single crystal metal oxide material.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF EMBODIMENTS

Figure 1:
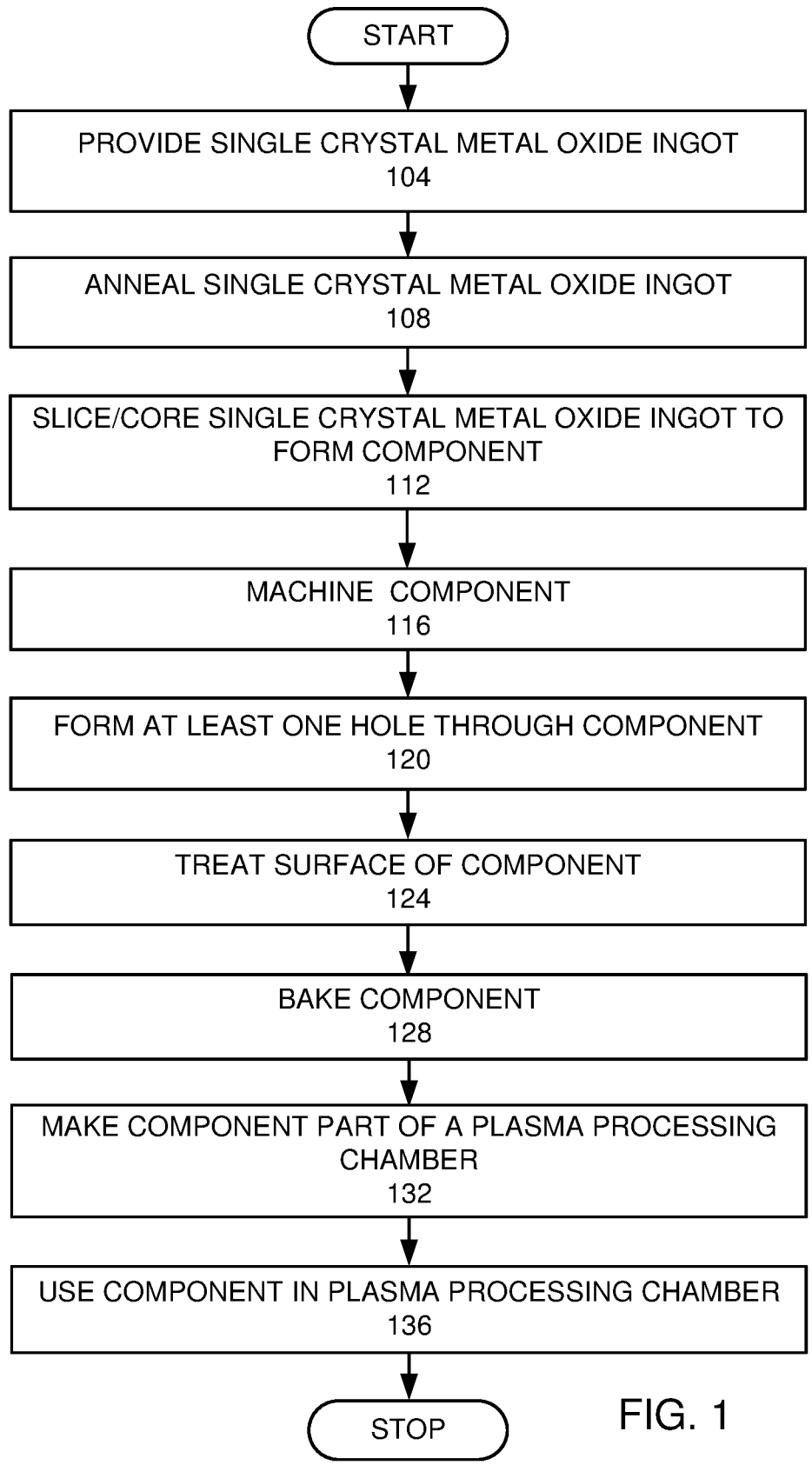
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Components, such as gas injectors of plasma processing chambers, are typically formed of an uncoated sintered aluminum oxide ($Al_2O_3$) material. Theoretically, a single crystal of $Al_2O_3$ (sapphire) could be used to decrease particle generation by removing grain boundaries that could be susceptible to chemical attack. Sapphire, however, is not as chemically resistant as other materials, such as yttrium oxide ($Y_2O_3$), yttrium aluminum garnet (YAG, $Y_3A_{15}O_{12}$), and spinel ($MgAl_2O_4$).

In the embodiments described herein, a single crystal metal oxide seed is used to grow a single crystal metal oxide ingot that is sculpted or carved to form a component of a plasma processing chamber. It will be understood that the term "single crystal" refers to a material where the crystal lattice of the entire material is orderly, continuous, and unbroken, and the arrangement of atoms is repeated throughout the entire material in all three dimensions. It will be understood, however, be understood that a single crystal ingot may still have some nonuniformities and crystal defects and dislocations. Sometimes, a single crystal is also known as a monocrystalline solid. According to an embodiment, the single crystal material has a 1-1-1 crystal orientation. The crystal orientation of the ingot depends on the seed crystal. It will be understood that components of a plasma processing chamber can be formed from single crystal ingots having other crystal orientations as well.

For a component of a plasma processing chamber, the single crystal metal oxide ingot need not be optics grade, and can be tooling grade. According to a particular embodiment, the ingot is formed of undoped YAG having a purity of at least 99.9%. In this embodiment, the single crystal YAG has a cubic crystallographic structure having a 1-1-1 crystal orientation with a density of at least 4.5 $g/cm^3$ and Mohs hardness in a range of about 8-8.5. According to this embodiment, the YAG ingot is substantially transparent and colorless.

An ideal gas injector would be formed of a single crystal chemically resistant material that also has high fracture toughness as well as high thermal shock resistance. Spinel, in single crystalline form, has high fracture toughness, high thermal shock resistance, and high etch resistance and is therefore a high performance material for a plasma chamber component. Spinel is also a desirable material for plasma chamber components because it is highly manufacturable and is a more cost efficient raw material than other materials, such as YAG and yttrium aluminum monoclinic (YAM).

According to an embodiment, the ingot is formed of single crystal spinel. The single crystal spinel can have a 1-1-1, 1-0-0, or 1-1-0 crystal orientation. According to an embodiment, the single crystal spinel does not contain any dopants.

To facilitate understanding, FIG. 1 is a high level flow chart of an embodiment. A single crystal metal oxide ingot is provided (step 104). According to an embodiment, a Czochralski crystal growth method is used to grow a single crystal ingot of a metal oxide from a seed crystal. In the Czochralski method, the seed crystal is dipped in "melt," or molten metal oxide in this embodiment, to grow the crystal.

The crystal growth process is relatively slow and can take up to several days. Dopant atoms of boron or phosphorous can be added to the molten metal oxide to dope the metal oxide. It will be noted that the composition of the melt can be changed during the Czochralski crystal growth process to result in a graded composition of the ingot. For example, a dopant can be added during the crystal growth process to grow an ingot that is doped in a graded manner.

Figure 2A:
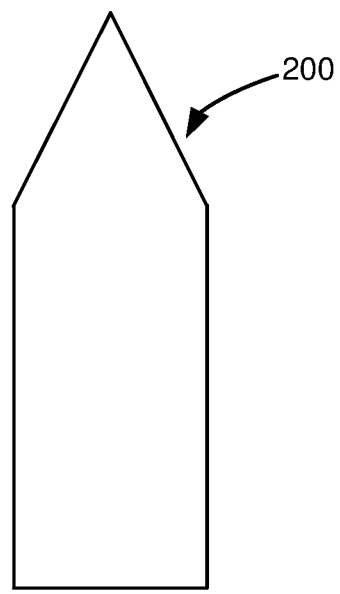
FIGS. 2A-D are schematic cross-sectional views of an ingot processed according to an embodiment.

According to an embodiment, the metal oxide is YAG, which is a synthetic crystal. According to another embodiment, the metal oxide is spinel. In this example, an ingot or boule of a single crystal YAG is formed using the Czochralski method. It will be understood that other methods of crystal growth can be used to grow an ingot or boule of single crystal metal oxide. FIG. 2A is a schematic side cross-sectional view of a metal oxide ingot 200. As discussed in more detail below, the metal oxide could be formed of other single crystal metal oxide, such as spinel, or rare earth oxide materials.

In this embodiment, after the single crystal metal oxide ingot is provided, the single crystal metal oxide ingot is annealed (step 108). During the Czochralski crystal growth method, heating of the single crystal metal oxide ingot may be uneven, where the outer part of the single crystal metal oxide ingot is cooled faster than the middle of the single crystal metal oxide ingot. As a result, the crystal structure may be nonuniform or irregular. Such nonuniformities may cause stress. The annealing process provides energy to allow the crystal atoms or molecules to move and become more uniform or regular and reduce or eliminate such stress.

Figure 2B:
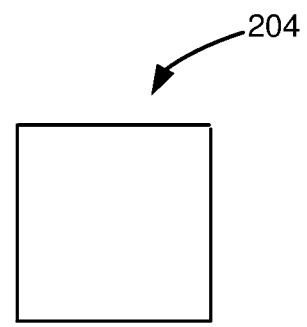

The single crystal metal oxide ingot is sliced or cored to form a component (step 112). The slicing or coring may be performed using a diamond edge saw or a core drill. According to an embodiment, the single crystal metal oxide ingot is machined to provide at least one gas injector for a plasma processing chamber. FIG. 2B is a schematic side cross-sectional view of a gas injector component 204 after the metal oxide ingot 200 has been sliced or cored. The gas injector can be a center injector or a side injector of a plasma processing chamber. According to a particular embodiment for a gas injector, the single crystal metal oxide ingot is grown to have a diameter of about 50 mm and a length of about 90 mm. It will be understood that it may be preferable to grow the ingot to have a cylindrical shape to reduce material waste.

According to other embodiments, a single crystal metal oxide ingot can be machined to form other components or portions of other components of a plasma processing chamber, such as edge rings, showerheads, windows or other components through which radio frequency (RF) energy can pass, crosses, sleeves, pins, nozzles, injectors, forks, arms, electrostatic chuck (ESC) ceramics, etc. For a component in a plasma processing chamber having any surface(s) exposed to plasma, it is beneficial for such surfaces to be a single crystal metal oxide surface covering such surfaces in order to minimize contaminants and particle defect caused by erosion of such surfaces due to plasma exposure. Thus, any plasma facing surface of a component can be formed of a single crystal metal oxide material to minimize erosion of the surface. In some embodiments, the portions of the component can be clad with a single crystal metal oxide material. In other embodiments, a single crystal metal oxide layer can be bonded to plasma facing surfaces of a component.

Figure 2C:
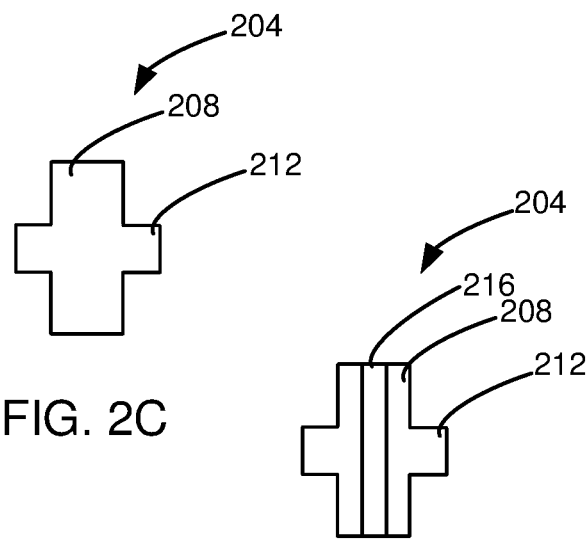

The ingot is further machined to further form the component (step 116). The machining process may include grinding the single crystal metal oxide body. FIG. 2C is a schematic cross-sectional view after the gas injector component 204 has been machined to further form the gas injector component 204 for a plasma processing chamber. In this embodiment, the gas injector component 204 comprises a cylindrical shaft 208 with a disc-shaped flange 212 surrounding the middle of the cylindrical shaft.

Figure 2D:
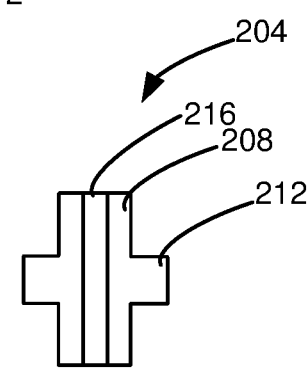

At least one hole is formed through the component (step 120). In this embodiment, a drill is used to form a hole through the gas injector component 204. FIG. 2D is a schematic cross-sectional view after the gas injector component 204 is drilled to form a hole 216 through the center of the cylindrical shaft 208. It will be understood that the gas injector component 204 is formed using a subtractive fabrication method in which the gas injector component 204 is carved or sculpted from a monolithic single crystal ingot.

After the component is formed by slicing/coring, machining, and drilling, the surface of the component is treated (step 124). The surface treatment may be used to remove contaminants and/or surface imperfections. Surface imperfections may be preferentially attacked, causing the generation of particles. Contaminants and surface imperfections may be caused by the machining or hole forming processes. Surface treatments may comprise one or more of thermal annealing, laser treatment, chemical treatment, electron beam treatment, polishing, surface plasma exposure, wet cleaning, and/or particle metrology. An example of polishing provides a mechanical polishing. Such a mechanical polishing may use a pad to rub an abrasive on the surface of the component to achieve an imperfection-free surface morphology. Surface plasma exposure may be accomplished by placing the component in a plasma processing chamber and exposing the surface of the component to a plasma. This creates a "steady-state" surface minimizing expensive seasoning processes on the chamber. In an embodiment of a wet clean, the surface of the component is exposed to a wet cleaning agent, that may include acids (hydrogen fluoride (HF), $HNO_3$, HCl), bases ($NH_4OH$, KOH, etc) and surfactants, which are effective in minimizing surface contamination. In an embodiment, a metrology tool is used to clean the surface. In the semiconductor field, a metrology tool may be used to measure the number of contaminants on a surface. Some metrology tools measure the number of contaminants by removing the contaminants from the surface of the component. Therefore, a metrology tool may be used to remove contaminants from the surface of the component. In an embodiment, treating the surface of the component (step 124) may first comprise a mechanical polishing, followed by a surface plasma exposure, followed by a particle metrology. Other embodiments would use other combinations of surface treatments.

The component can be subjected to an annealing or bake process (step 128) that may help in releasing trapped gases and could also refine the surface morphology. According to an embodiment, the annealing process is performed at 1200° C. for about eight hours. In another embodiment, a fluorine torch can be used for surface treatment. Surface treatment can be used to reduce particle generation, to reduce seasoning time in chamber, and to improve surface finish. It will be noted that it may be especially beneficial to treat the surface of a component, such as an edge ring, for example, as an edge ring has a relatively large surface area in chamber.

The component is then made part of a plasma processing chamber (step 132). In this example, the component is mounted to the gas injector of the plasma processing chamber. The component is used in the plasma processing chamber to process a plurality of substrates (step 136). For example, the component is used in the plasma processing chamber to sequentially process over 100 substrates.

Figures 2E, 2F:
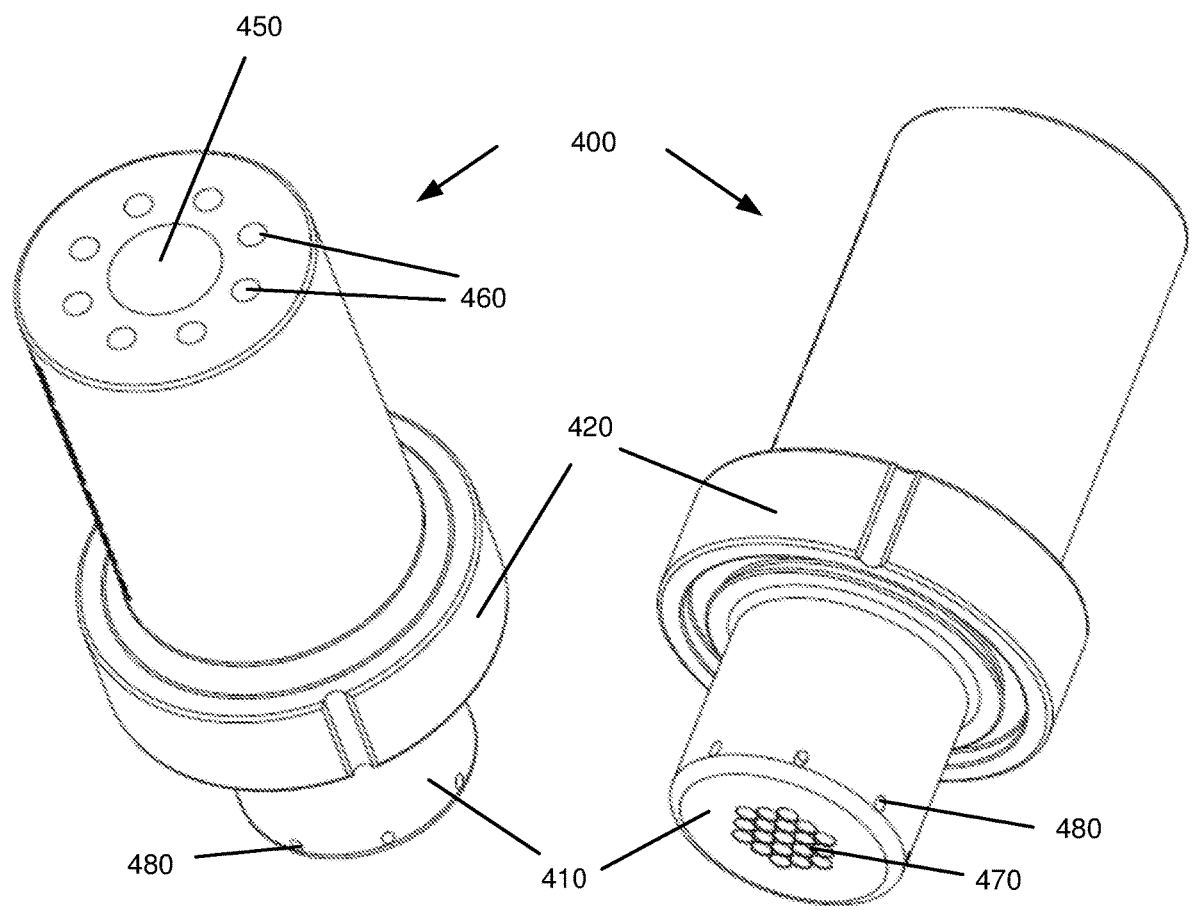
FIGS. 2E and 2F are perspective views of a gas injector component of a plasma processing chamber according to an embodiment.

FIGS. 2E and 2F are perspective views of another embodiment of a gas injector 400 of a plasma processing chamber. As shown in FIG. 2E, there is a central passage 450 and smaller passages 460 surrounding the central passage 450. In this embodiment, the center passage 450 feeds into multiple gas holes 470, and each of the smaller passages 460 feeds into a side gas injector hole 480 in the nose 410. It will be understood that each of the passages 460 has a portion that is oriented at an angle within the gas injector 400 (an angle with the axis of the gas injector, or an angle with the central gas passage) to feed into a gas injector hole 480. The portion of the passage 460 can be angled in a range of about 10°-70°. In one embodiment, the portion of the passage 460 is angled at about 45°. According to another embodiment, the portion of the passage 460 can be angled at a different angle, such as an angle of about 90°. As shown in FIG. 2F, there are gas holes 470 in a honeycomb pattern at the bottom surface of the nose 410 of the gas injector 400. As noted above, the nose 410 is the portion of the gas injector 400, below the flange 420, that is exposed to plasma in the plasma processing chamber. These passages 450, 460 and holes 470, 480 are machined or drilled, as described above with reference to step 120.

Figures 2G, 2H:
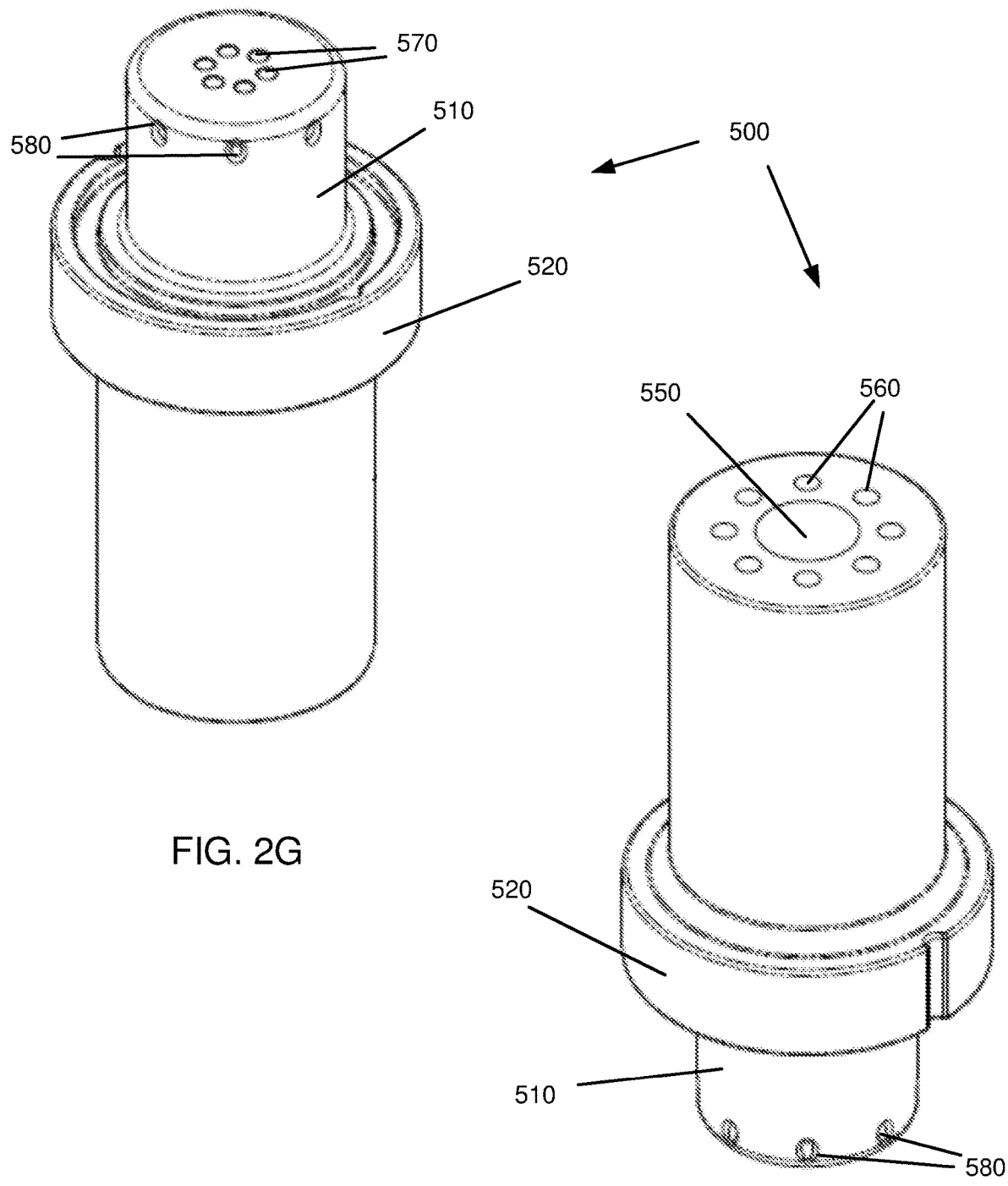
FIGS. 2G and 2H are perspective views of a gas injector component of a plasma processing chamber according to another embodiment.

FIGS. 2G and 2H are perspective view of yet another embodiment of a gas injector 500 of a plasma processing chamber. As shown in FIG. 2G, there is a central passage 550 and eight smaller passages 560 surrounding the central passage 550. In this embodiment, the center passage 550 feeds into multiple gas holes 570, and each of the smaller passages 560 feeds into a side gas injector hole 580 in the nose 510. It will be understood that each of the passages 560 has a portion that is oriented at an angle within the gas injector 500 to feed into a gas injector hole 580. In one embodiment, the portion of the passage 560 can be angled at about 45°. According to another embodiment, the portion of the passage 560 can be angled at a different angle, such as an angle of about 90°. As shown in FIG. 2H, there are six gas holes 570 arranged in a circle at the bottom surface of the nose 510 of the gas injector 500. As noted above, the nose 510 is the portion of the gas injector 500, below the flange 520, that is exposed to plasma in the plasma processing chamber. These passages 550, 560 and holes 570, 580 are machined or drilled, as described above with reference to step 120.

Although a few embodiments of gas injectors are described and shown, it will be noted that a gas injector can have different geometries. A gas injector has at least one gas passage for receiving gas and then injecting the gas into plasma in the plasma processing chamber. It will be understood that a gas injector can have any number of holes and passages, so long as there is one gas passage. The passage(s) through the gas injector can be at any angle. According to some embodiments, the gas injector has side gas outlets for side tuning. According to other embodiments, the gas injector does not have any side gas outlets. In some embodiments, each gas passage is individually controlled. In other embodiments, the gas passages are all controlled together.

The Czochralski process is described above for growing the single crystal metal oxide ingot. According to another embodiment, other crystal growth methods can be used to grow the single crystal metal oxide ingot.

Figure 2I:
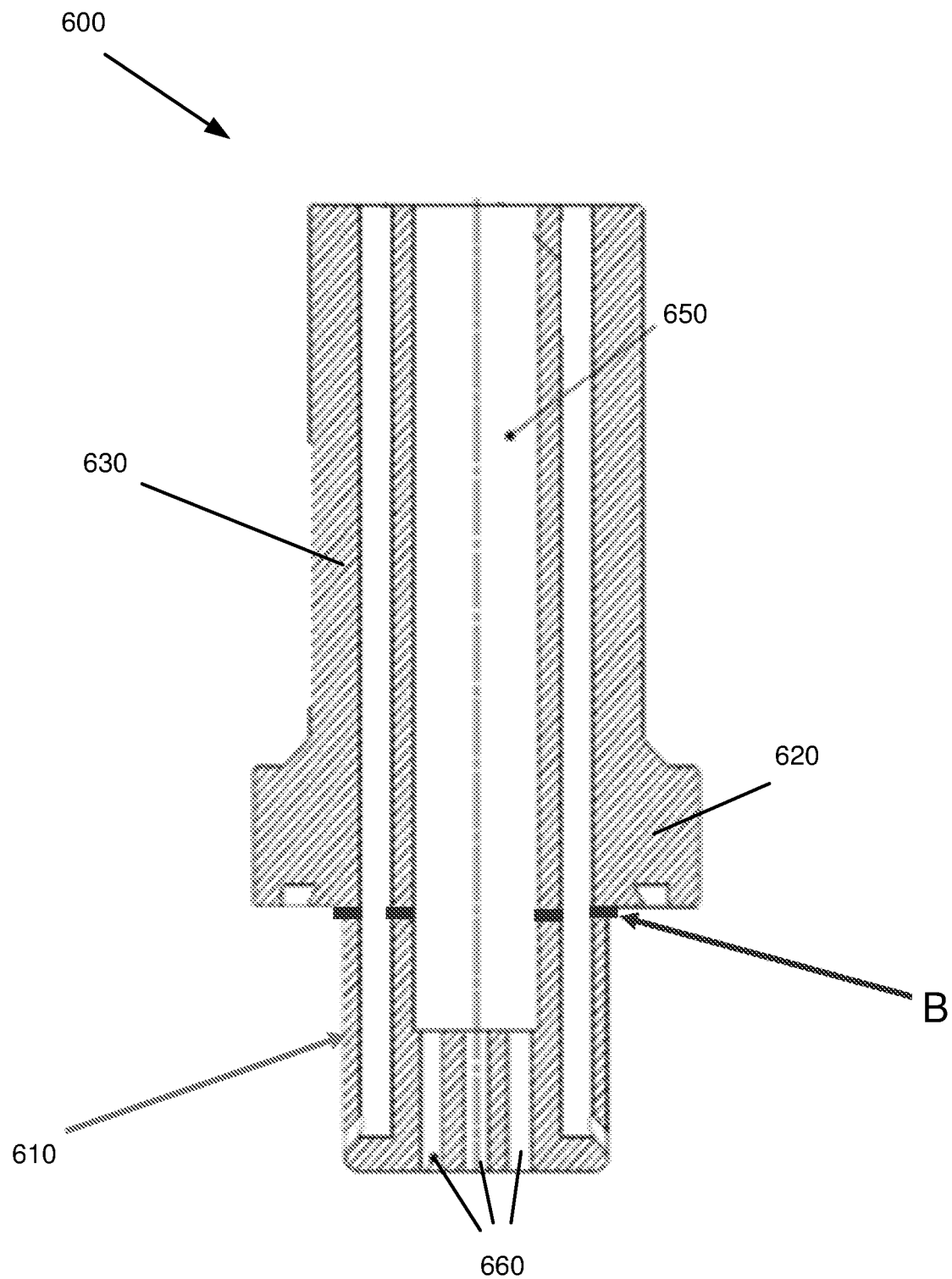
FIG. 2I is a side cross-sectional view of a diffusion bonded gas injector component of a plasma processing chamber according to an embodiment.

According to some embodiments, the single crystal metal oxide component is not the entire part (e.g., gas injector) of the plasma processing chamber, but a portion or component of the part. For example, in one embodiment, the single crystal metal oxide component is the "nose" of a gas injector. The "nose" is the portion of the gas injector that is exposed to plasma in the processing chamber. Most particle generation occurs in this area. The nose can be attached to or fused with another portion of the gas injector using a variety of bonding methods, including diffusion bonding, which can be used to join two dissimilar materials. According to the embodiment shown in FIG. 2I, the single crystal metal oxide portion of the gas injector 600 is the "nose" 610, which is the portion below the flange 620. In the embodiment shown in FIG. 2I, the nose 610 is bonded to the rest of the gas injector 600, which can be formed of a different material (e.g., polycrystalline material), as shown by the diffusion bonding line B. The rest of the gas injector 600, including the flange 620 and cylindrical shaft 630, does not have to be formed of this single crystal metal oxide material, as only the nose 610 has surfaces exposed to plasma in the plasma processing chamber. Therefore, in an embodiment, instead of forming the entire gas injector 600 of YAG, the rest of the gas injector 600 can be formed of a less expensive, more cost effective material, such as tooling grade YAG, sintering YAG or other ceramic (e.g., aluminum oxide ($Al_2O_3$)). The gas injector 600 has a central passage 650 that feeds into multiple smaller passages 660.

According to some embodiments, an ingot may not be long enough and two single crystal ingots are joined together to form a component of a plasma processing chamber. A bonding process, such as diffusion bonding, can be used to join the two single crystal metal oxide ingots. As noted above, it is possible to join two dissimilar materials. For example, a single crystal material can be diffusion bonded to a ceramic. Diffusion bonding can also be used to join a doped single crystal metal oxide to a non-doped single crystal metal oxide.

In a diffusion bonding process, each of the surfaces to be bonded together is super polished first to achieve an extremely smooth surface that is free of contaminants. Diffusion bonding is a process in which two surfaces to be bonded together are placed in contact and clamped together and then subjected to high temperature and high pressure. When two parts are diffusion bonded together, the two parts diffuse into one another and they become as one single crystal material. A diffusion bonding process can take at least several hours for the atoms of the two surfaces to intersperse across the boundaries of the surfaces and create a bond. Typically, the two parts to be bonded are heated very slowly (up to 24 hours or more) to a high temperature, which is at least about ⅔ of the melt temperature of the material. The two parts are then held together at this high temperature under high pressure until the diffusion takes place and the two parts are bonded together. After the two parts are bonded together, the diffusion bonded part is allowed to cool slowly (up to about 24 hours or more) to room temperature.

According to some embodiments, two or more single crystal metal oxide ingots can be bonded together to form a component if a single ingot is not large enough, as noted above. In one embodiment for a gas injector, for example, two or more ingots are bonded together before passages are drilled through the ingots. According to another embodiment, each individual ingot is drilled first to form the passages, and the passages of the two ingots are then aligned and the ingots are bonded together to form the component. A diffusion bonded component may not be as strong as a component formed from a monolithic ingot. Thus, a diffusion bonded component may not be able to mechanically withstand drilling and cracks may result. However, drilling passages after bonding eliminates the need to align predrilled passages, which can be difficult.

Figure 3:
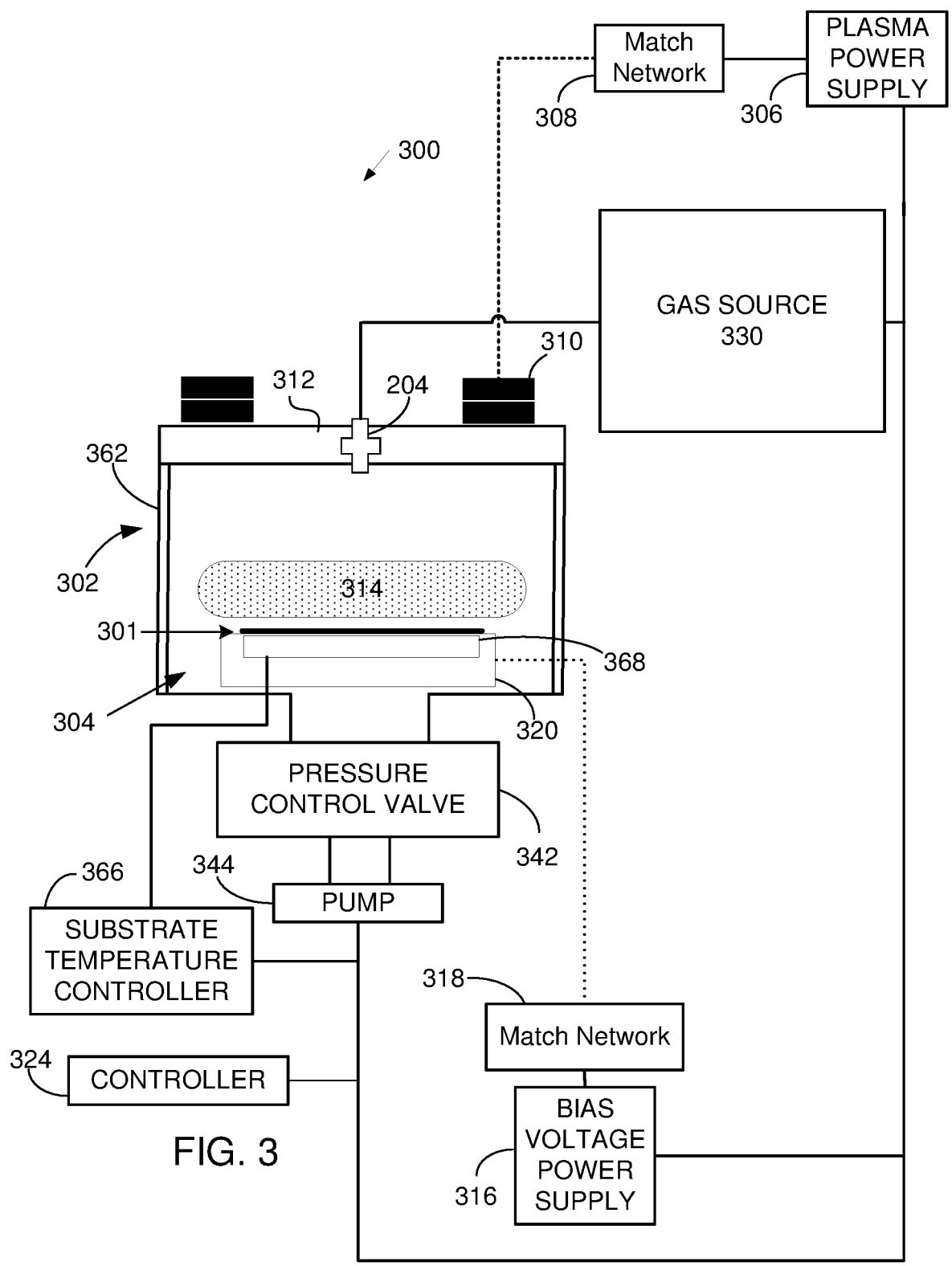
FIG. 3 is a schematic view of a plasma processing chamber according to an embodiment.

FIG. 3 schematically illustrates an example of a plasma processing system 300. The plasma processing system 300 may be used to process a substrate 301 in accordance with one embodiment. The plasma processing system 300 includes a plasma reactor 302 having a plasma processing chamber 304, enclosed by a chamber wall 362. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 301. The electrode 320 provides a chuck for the substrate 301, where the electrode 320 acts as an electrostatic chuck. A substrate temperature controller 366 is controllably connected to a Peltier heater/cooler 368. A controller 324 sets points for the plasma power supply 306, the substrate temperature controller 366, and the wafer bias voltage power supply 316.

The plasma power supply 306 and the wafer bias voltage power supply 316 may be configured to operate at specific radio frequencies such as 13.56 MHz, 27 MHz, 2 MHz, 1 MHz, 400 kHz, or combinations thereof. Plasma power supply 306 and wafer bias voltage power supply 316 may be appropriately sized to supply a range of powers in order to achieve desired process performance. For example, in one embodiment, the plasma power supply 306 may supply the power in a range of 50 to 5000 Watts, and the wafer bias voltage power supply 316 may supply a bias voltage in a range of 20 to 2000 V. In addition, the TCP coil 310 and/or the electrode 320 may be comprised of two or more sub-coils or sub-electrodes. The two or more sub-coils or sub-electrodes may be powered by a single power supply or powered by multiple power supplies.

As shown in FIG. 3, the plasma processing system 300 further includes a gas source 330. The gas source 330 provides gas or remote plasma to the plasma reactor 302 through a single crystal metal oxide gas feed 204. The process gases and by-products are removed from the plasma processing chamber 304 via a pressure control valve 342 and a pump 344. The pressure control valve 342 and the pump 344 also serve to maintain a particular pressure within the plasma processing chamber 304. The gas source 330 is controlled by the controller 324. A Kiyo® by Lam Research Corp. of Fremont, CA, may be used to practice an embodiment.

The plasma processing system 300 is used to sequentially etch a plurality of substrates 301. Because the single crystal metal oxide gas feed 204 is formed from a single crystal metal oxide, the single crystal metal oxide gas feed 204 causes fewer contaminants and has fewer defects. As a result, the single crystal metal oxide gas feed 204 is more resistant to erosion caused by the plasma process and the single crystal metal oxide gas feed 204 provides less contamination during the plasma processing.

In other embodiments, other components of the plasma processing system 300 may be a single crystal metal oxide component. The single crystal metal oxide component has a porosity of less than 0.1% and a purity of >99%. Such other components include edge rings, showerheads, windows or other components through which radio frequency (RF) energy can pass, crosses, sleeves, pins, nozzles, injectors, forks, arms, electrostatic chuck (ESC) ceramics, etc. In other embodiments, other types of plasma processing systems may be used. Various embodiments provide a component, such as a gas injector, for a plasma processing chamber. The component comprises a single crystal metal oxide body. The component may also have at least one through-hole. In other embodiments, a method for forming a component for a plasma processing chamber is provided. A single crystal metal oxide ingot is provided. The single crystal metal oxide ingot is machined to form the component. At least one through-hole is formed in the component. The least one through-hole may be parallel to the axis of the component (e.g. a rotational axis dotdashed line in FIG. 2I). The component is surface treated. In other embodiments, other single crystal metal oxides may be used. For example, the component may be formed from sapphire (single crystal aluminum oxide ($Al_2O_3$)), spinel, YAG, YAM, yttrium aluminum perovskite (YAP), or yttrium-stabilized zirconia (YSZ). The component may be formed from single crystal ingots grown from variants of spinel, YAG, yttrium oxide, aluminum oxide, or zirconium oxide, which can have low percentage additive and dopants.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A component of a plasma processing chamber, wherein at least one plasma facing surface of the component comprises single crystal metal oxide material, wherein the single crystal metal oxide material is single crystal spinel.

2. The component of claim 1, wherein the at the least one plasma facing surface of the component is machined from a single crystal metal oxide ingot.

3. The component of claim 1, wherein the at least one plasma facing surface comprises a layer of the single crystal metal oxide material bonded to a body of the component.

4. The component of claim 1, wherein the component is a gas injector, wherein the nose of the gas injector comprises the single crystal metal oxide material, wherein the nose is a portion of the gas injector that is exposed to plasma in the plasma processing chamber.

5. A component of a plasma processing chamber, wherein at least one plasma facing surface of the component comprises single crystal metal oxide material, wherein the component is a gas injector, wherein the nose of the gas injector comprises the single crystal metal oxide material, wherein the nose is a portion of the gas injector that is exposed to plasma in the plasma processing chamber, and wherein the nose is diffusion bonded to a body of the component, wherein the body is formed of a material that is different from the single crystal metal oxide material.

6. The component of claim 5, wherein the body is formed of a polycrystalline material.

7. A gas injector of a plasma processing chamber, comprising:
- a body; and
- at least one plasma facing surface comprising a single crystal metal oxide material, wherein the single crystal metal oxide material is single crystal spinel.

8. The gas injector of claim 7, wherein the gas injector is machined from a single crystal metal oxide ingot.

9. A gas injector of a plasma processing chamber, comprising:
- a body; and
- at least one plasma facing surface comprising a single crystal metal oxide material, wherein the gas injector is machined from a single crystal metal oxide ingot and wherein the single crystal metal oxide ingot is annealed before being machined.

10. The gas injector of claim 9, wherein the single crystal metal oxide material is single crystal YAG.

11. The gas injector of claim 9, further comprising a central passage machined through the body and a plurality of smaller passages machined through the body, wherein the plurality of smaller passages surround the central passage and wherein each of the plurality of smaller passages feeds into a side gas injector hole and each of the plurality of smaller passages has a portion that is oriented at an angle within the gas injector to feed into the side gas injector hole.

\* \* \* \* \*